United States Patent [19]

Boscove et al.

[11] Patent Number: 4,796,206

[45] Date of Patent: Jan. 3, 1989

[54] COMPUTER ASSISTED VEHICLE SERVICE FEATURING SIGNATURE ANALYSIS AND ARTIFICIAL INTELLIGENCE

[75] Inventors: Joseph A. Boscove, Highland Beach; Hobart L. Kurtz, Boca Raton, both of Fla.; Jeffrey E. Prince, William P. Wiegand, both of Birmingham, Mich.

[73] Assignee: International Business Machines Corporation, Armonk, N.Y.

[21] Appl. No.: 869,534

[22] Filed: Jun. 2, 1986

[51] Int. Cl.$^4$ .................. G06F 11/32; G06F 15/20
[52] U.S. Cl. ..................... 364/551.01; 364/431.01; 73/116
[58] Field of Search .................. 364/550, 551, 431.01, 364/424; 73/116, 117.3

[56] References Cited

U.S. PATENT DOCUMENTS

| | | | |
|---|---|---|---|
| 4,125,894 | 11/1978 | Cashel et al. | 364/442 |
| 4,270,174 | 5/1981 | Karlin et al. | 364/551 |
| 4,295,363 | 10/1981 | Buck et al. | 73/117.3 |
| 4,375,672 | 3/1983 | Kato et al. | 364/551 |
| 4,404,639 | 9/1983 | McGuire et al. | 364/551 |
| 4,418,388 | 11/1983 | Allgor et al. | 364/431.01 |
| 4,441,359 | 4/1984 | Ezoe | 73/117 |
| 4,476,531 | 10/1984 | Marino et al. | 364/431.01 |
| 4,649,515 | 3/1987 | Thompson et al. | 371/15 X |
| 4,694,408 | 9/1987 | Zaleski | 364/551 |

OTHER PUBLICATIONS

Booklet: "The Guide" (Personal Computer), vol. IV, 1985, International Business Machines Corp. Front & Back Covers, pp. 8, 10, 11, 31, 34, 36.
Book: "Programmer's Guide to the IBM PC", Peter Norton, 1985, Microsoft Press, Contents, pp. 5, 6, 7, 12, 42-44, 68, 102-106, 130, 143, 144.
Book: "Electronic Engine Controls", Chilton Book Co., 1985 Frontispiece, Contents, pp. 38-41, 239-259, 274, 275.
Article: "Specific Cell Location Assembly for Displays", R. V. Ballou et al, IBM Technical Disclosure Bulletin, Feb. 1985, vol. 27, No. 9, pp. 5104-5106.
Article: "Computerized Diagnostic Tester at Hand", Electrical World, Aug. 1, 1975, pp. 36-38.
Article: "A Digital Electronic System for Automobile Testing and Diagnosis", T. A. Cross, IEE Conference Jul. 6-9, 1976, London, England, pp. 152-159.

Primary Examiner—Gary Chin
Assistant Examiner—Thomas G. Black
Attorney, Agent, or Firm—D. Kendall Cooper; Richard A. Tomlin

[57] ABSTRACT

A computer based technician terminal is connected to a vehicle being serviced using an assembly line data link (ALDL) connection from an on-board computer. The data link provides status information and fault codes. The technician is led through various procedures. During set up, the technician connects an ALDL cable from the terminal to the vehicle, the vehicle indentification number (VIN) is entered and vehicle options are identified. A fault detection procedure (FDP) in the terminal detects vehicle malfunctions by interrogating data received (via the ALDL) from the on-board computer. A fault analysis procedure (FAP), using the fault codes from a table as arguments, does a sequential compare against the contents of a fault analysis table containing fault codes. In a fault sequencing procedure (FSP), for each fault code passed by the FAP, there is a list containing the name(s) of one or more isolation procedures. A fault isolation procedure (FIP) is provided for electrical or electronic components on the vehicle to perform a complete test of the related part using a multifunction test probe. Fault repair procedures guide the technician through the proper steps to accomplish the repair, replacement or adjustment required.

6 Claims, 10 Drawing Sheets

ALDL CABLE

FIG. 6

PROBE CABLE

MAIN MENU

| DIAGNOSTICS | VOLT/OHM METER |
| SERVICE MANUAL | DYNAMIC DISPLAY |
| SERVICE BULLETIN | VEHICLE SPECS |
| INSTRUCTIONS | COMMUNICATIONS |

HELP

FIG. 8A

ECM TO TPS CIRCUIT

FIG. 8B

INTERPOSER CABLE INSERTED

TO PROBE CONTROLS

FIG. 10A

FAULT TABLE ← 15a

| 002 | 009 | 016 | 113 | 230 | 232 | | | |

FIG. 10B

FAULT ANALYSIS TABLE

| FAULT CODES | | | FIPS TO EXECUTE | | | |
|---|---|---|---|---|---|---|
| 401 | 637 | 697 | 101 | 102 | | |
| 401 | 697 | | 101 | 102 | 137 | |
| 401 | | | 101 | 102 | 137 | 146 |
| 002 | 113 | 406 | 051 | 030 | | |
| 002 | 113 | | (030) | (097) | | |
| 113 | | | 030 | (011) | 097 | |
| 230 | 231 | 232 | 137 | 402 | | |
| 230 | | | (402) | (404) | (403) | |
| 232 | •••• | | 403 | 406 | (401) | |

FIPS EXECUTED UNTIL THE PROBLEM IS FIXED

| 030 | 097 | 011 | 402 | 404 | 403 | 406 | 401 | |

COMPUTER ASSISTED VEHICLE SERVICE FEATURING SIGNATURE ANALYSIS AND ARTIFICIAL INTELLIGENCE

CROSS REFERENCE TO RELATED APPLICATION

Cross reference is made to the following patent applications, such application having a common filing data and a common assignee with the present application:

U.S. patent application Ser. No. 06/869,870 filed June 2, 1986, entitled "Fault Isolation for Vehicle Using A Multifunction Test Probe" having R. V. Ballou et al as inventors.

PRIOR ART REFERENCES

The following prior art references are of interest and are referred to in the specification. The first four references are specifically incorporated by reference herein.

1. Booklet: "The Guide" (Personal Computers), Volume IV, 1985, International Business Machines Corporation. Front and back covers, Pp. 8, 10, 11, 31, 34, 36.
2. Book: "Programmer's Guide to the IBM PC", Peter Norton 1985, Microsoft Press, Contents, Pp. 5, 6, 7, 12, 42–44, 68, 102–106, 130, 143. 144.
3. Book: "Electronic Engine Controls", Chilton Book Co., 1985, Frontispiece, Contents, Pp. 38–41, 239–259, 274–275.
4. Article" "Speciic Cell Location Assembly for Displays" R. V. Ballou et al, IBM Technical Disclosure Bulletin February 1985, Vol. 27, No. 9, Pp. 5104–5106.
5. Article: "Computerized Diagnostic Tester at Hand", Electrical World, Aug. 1, 1975, Pp. 36–38.
6. Article: "A Digital Electronic System for Automobile TEsting and Diagnosis", T.A. Cross, IEE Conference July 6–9, 1976 London, England, Pp. 152–159.

BACKGROUND OF THE INVENTION

This invention relates to computerized automotive vehicle diagnostic apparatus and more particularly to a more efficient apparatus of this nature having improved performance in relation to the diagnostic procedures and related computer programs.

Microcomputers, electronic sensors and other components are incorporated into vehicles to monitor and control engine operations and other functions.

The increasing amount of electronic, electrical and electro-mechanical content in automobile designs has created a severe problem for the vehicle servicing environment. The service tools available for servicing do not provide the capabilities needed to diagnose and repair problems which are directly or indirectly related to the electronics. This has resulted in long diagnostic times, incorrect repairs and multiple service visits for the same problem.

Considering the prior art references noted above, Reference 1, "The Guide" describes an IBM Personal Computer AT that is a useful element in the diagnostic system set forth herein. Reference 2, The Norton book, illustrates various characteristics of the IBM Personal Computer AT such as programming, the microprocessor, keyboard, etc. Reference 3, the Chilton book, describes engine control modules and systems that that are utilized herein. Reference 4, the Ballou et al article, describes a representative touch panel that may be used in the practice of the invention. References 5 and 6 relate to computer-based diagnostic systems for engines and are merely representative of prior systems. Applicants' system procedures are distinctively different from those systems.

The primary objective of the present invention is to provide semi-automated diagnostic apparatus for vehicles, such apparatus incorporating computer diagnostics.

SUMMARY OF THE INVENTION

In the technique disclosed herein, programs execute on an off-board computer, and by use of visual display, prompt a technician to change the vehicle's state. For each state change, a sequence of tests are executed comparing information in data streams from a vehicle on-board computer against known good parameters or signatures. The signature analysis includes interrogation of single parameters and the correlation of multiple parameters.

In the service environment, where more time can be allocated for testing than that allowed at the end of an assembly line, enhanced versions of the end of line test programs can be executed to provide detection capability for more vehicle problems, Building on this ability to detect faults with a computer, the present system design describes how, by the use of artificial intelligence concepts, a technician terminal can become "smarter" in it's ability to diagnose more vehicle problems.

For a better understanding of the present invention, together with other and further advantages and features thereof, reference is made to the description taken in connection with the accompanying drawings, the scope of the invention being pointed out in the appended claims.

BRIEF DESCRIPTION OF THE DRAWINGS

Referring to the drawings.

DETAILED DESCRIPTION

A technique is described herein which makes use of a computer based technician terminal that connects to a vehicle being serviced using the assembly line data link (ALDL). This data link is used by the various vehicle manufacturers to test the vehicle at the end of the assembly lines. It allows an off-board computer to communicate with the computers on-board the vehicle.

When commanded, the on-board computer outputs data frames on the data link which contain information about the state of the various sensors, switches, relays and actuators that are controlled by the on-board computers. Included in the data are error codes representing faults detected and stored by the on-board computers.

Figure 1:
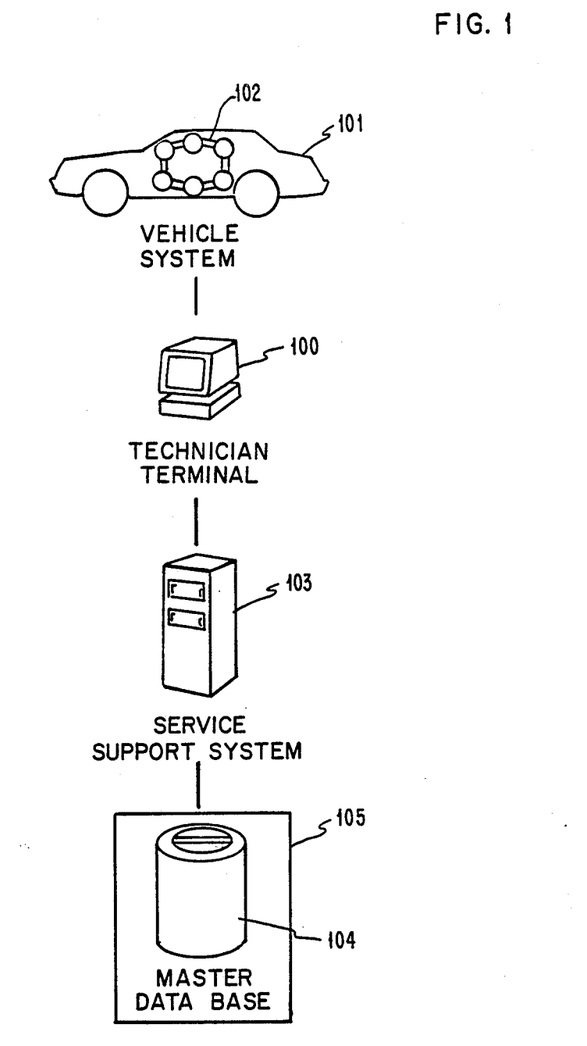
FIG. 1 illustrates a network in which one or more technician terminals such as that described herein may be connected.

The network of FIG. 1 includes a technician terminal 100 interfaced with a vehicle 101 and more specifically with the vehicle computer control system 102. Terminal 100 has a data entry facility and touch interactive/menu driven display, and also incorporates a computer such as the IBM Personal Computer AT, Prior Art References 1 and 2. A touch panel for the technician terminal is like that described in the Ballou et al Prior Art Reference 4. The computer control system 102 is like the control systems described in the Chilton Prior Art Reference 3, as further illustrated in FIG. 2 herein.

Service Support System 103, FIG. 1, may support one or more technician terminals and serve as a regional vehicle data base. A host computer 105 including a master data base 104 acts as a service support system interface to the user company headquarters, provides network management and supplies realtime feedback to manufacturing and engineering groups, for example. Alternatively, the technician terminals may be connected directly to the host computer 105 and data base 104.

The automotive industry has for the past several years incorporated microcomputers, electronic sensors and many electro-mechanical components into vehicle designs to provide better monitoring and control of the engine operations. More electronics are being added to provide control for other functions as well. Transmission, radio, heat/ventilation/air conditioners, instrument panels, memory seats and mirrors, etc. are some examples. Future designs will include ever increasing amounts of hi-tech features such as cellular radio telephone, vehicle attitude, collision avoidance, etc.

Figure 2:
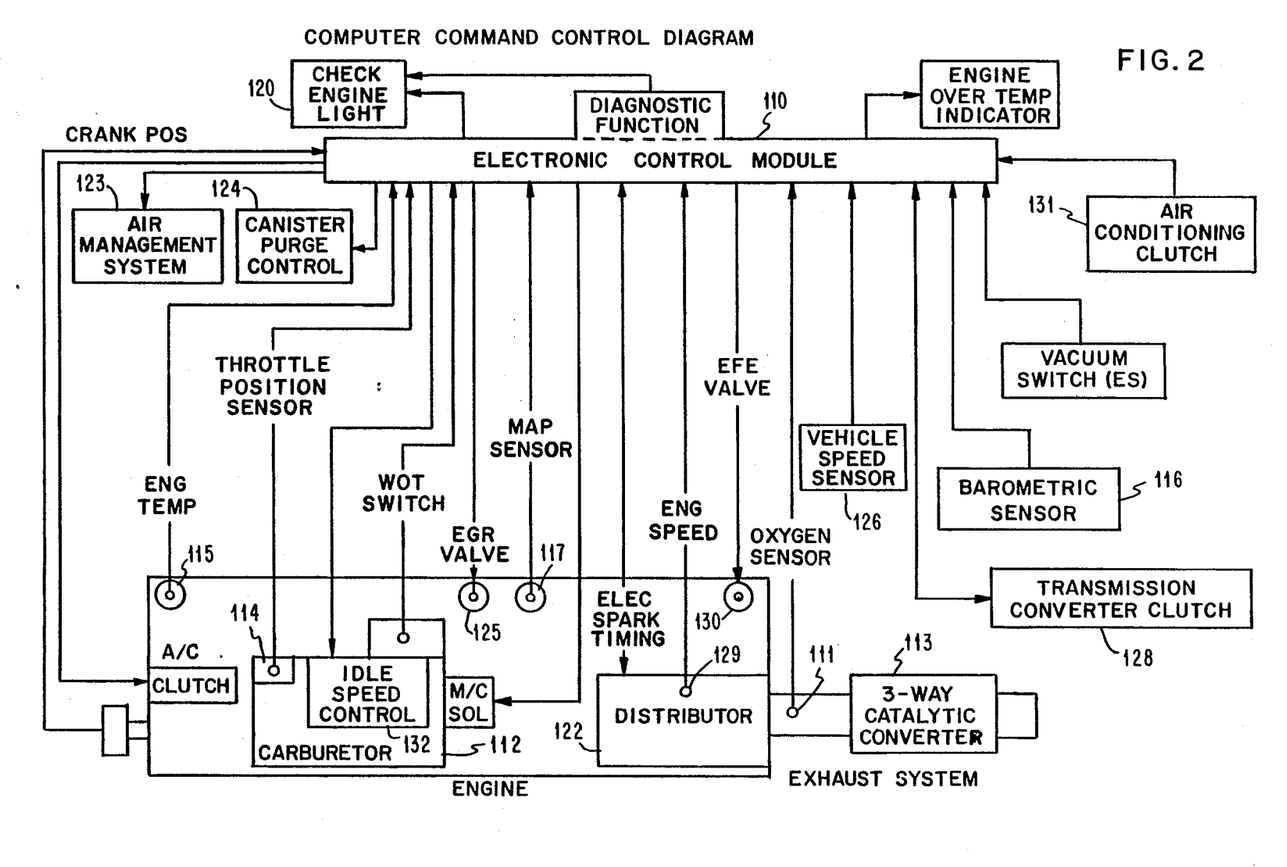
FIG. 2 illustrates an engine control system for use on a vehicle shown in FIG. 1.

FIG. 2 illustrates an engine control system used in General Motors (GM) vehicles since the 1981 model year and designated the Computer Command Control (CCC) System. This system has many components in common with the earlier GM system referred to as the Computer Controlled Catalytic Converter (C-4) system. These include the Electronic Control Module (ECM) 110, which is capable of monitoring and adjusting more sensors and components than the ECM used on the C-4 system, an oxygen sensor 111, an electronically controlled variable-mixture carburetor 112, a three way catalytic converter 113, throttle position sensor 114 and coolant temperature sensor 115, a barometric pressure (BARO) sensor 116, a manifold absolute pressure (MAP) sensor 117, a "Check Engine" light 120 on the instrument cluster, and an Electronic Spark Timing (EST) distributor 122, which on some engines (turbocharged) is equipped with an Electronic Spark Control (ESC) that retards ignition spark under some conditions (detonation, etc.).

Other components used by the CCC System include the Air Injection Reaction (AIR) Management System 123, charcoal canister purge control 124, Exhaust Gas Recirculation (EGR) valve control 125, engine speed sensor 129, transmission torque converter clutch solenoid 128 (automatic transmission models only), idle speed control 132, and early fuel evaporative (EFE) system 130.

The ECM 110, in addition to monitoring sensors and sending a control signal to the carburetor, also controls the following components or sub-systems; charcoal canister purge control 124, AIR Management System 123, idle speed control 132, automatic transmission converter clutch 128, distributor 122 ignition timing, EGR valve control 125, EFE control 130, and the air conditioner compressor clutch 131. The CCC ECM is equipped with a PROM assembly similar to the one used in the C-4 ECM.

The Air Management System 123 is an emission control that provides additional oxygen either to the catalyst or the cylinder head ports (in some cases exhaust manifold), is composed of an air switching valve and/or an air control valve, controls the air pump flow and is itself controlled by the ECM 110.

The charcoal canister purge control 124 is an electrically operated solenoid valve controlled by ECM 110 and when energized, blocks vacuum from reaching the canister purge valve. When ECM 110 de-energizes the purge control solenoid, vacuum is allowed to reach the canister and operate the purge valve. This releases the fuel vapors collected in the canister into the induction system.

The EGR valve control solenoid 125 is activated by ECM 110. When the engine is cold, the ECM energizes the solenoid. This blocks the vacuum signal to the EGR valve 125. When the engine is warm, the ECM de-energizes the solenoid and the vacuum signal is allowed to reach and activate the EGR valve.

The Transmission Converter Clutch (TCC) 128 lock is controlled by the ECM 110 through an electrical solenoid in the transmission. When the vehicle speed sensor in the instrument panel signals the ECM that the vehicle has reached the correct speed, the ECM energizes the solenoid which allows the torque converter to mechanically couple the engine to the transmission. When the brake pedal is pushed or during deceleration, passing, etc., the ECM returns the transmission to fluid drive.

The idle speed control 132 adjusts the idle speed to load conditions, and lowers the idle speed under no-load or low-load conditions to conserve gasoline.

The Early Fuel Evaporative (EFE) system 130 used on some engines provides rapid heat to the engine induction system to promote smooth start-up and operation.

As noted, the service tools heretofore available for servicing have not provided the necessary capabilities needed to diagnose and repair problems which are directly or indirectly related to the vehicle electronics. As a result there have been long diagnostic times, incorrect repairs and multiple service visits for the same problem.

Figure 3:
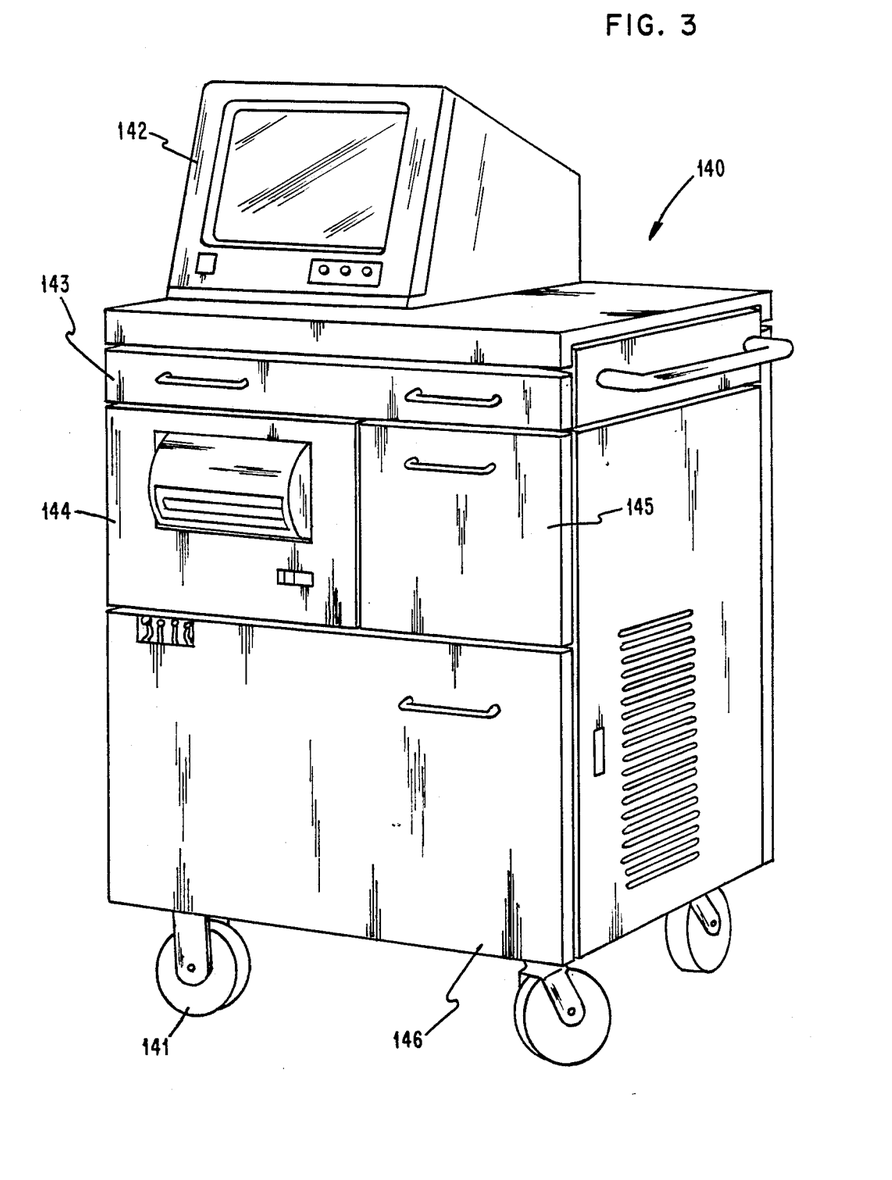
FIG. 3 is a perspective view of the technician terminal in a console configuration.
Figure 4:
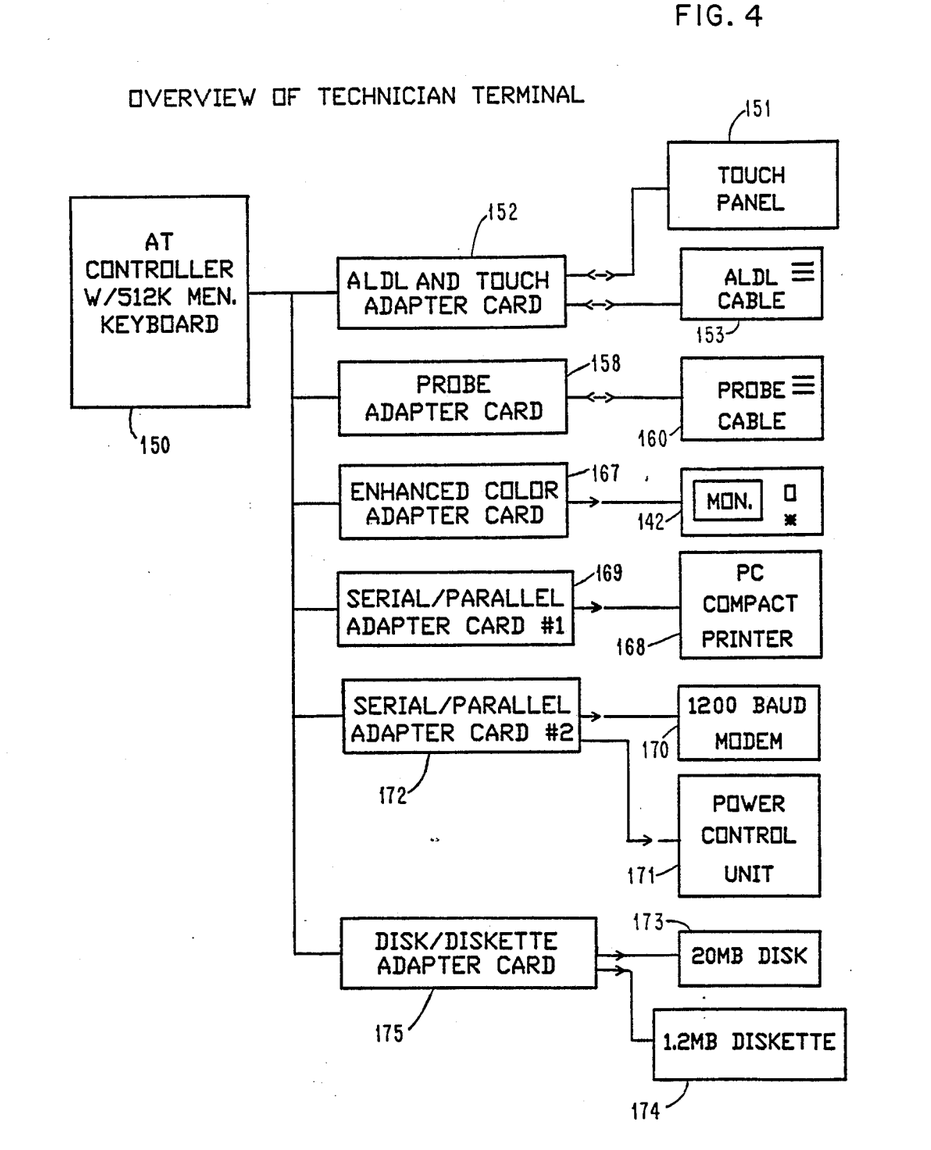
FIG. 4 is a block diagram of the major components in the technician terminal.

The technician terminal FIGS. 3 and 4, are designed to overcome these problems and may typically incorporate the following elements:

PC/AT Based Controller
512KB Memory
1.2 MB 5.25 Diskette Drive
20MB Fixed Disk Drive
13" Color Monitor
Infrared (I/R) Touch Panel
Communications Card
ALDL Attachment Card & Cables
Probe Attachment Card & Cables
Printer
Mobile Work STation
Fault Isolation Repair Procedure Program Executor (FEX) Diagnostic Executive
Remote Update Facility

FEX Development System (FDS)

In FIG. 3, the technician terminal is housed in a console 140 mounted on wheels, such as wheel 141 for greater mobility. Console 140 has a display monitor 142 integrally incorporated therewith, monitor 142 having an infrared touch panel on the face thereof. A keyboard, such as the PC AT keyboard, is incorporated within drawer 143. The console also has a printer 144. Drawers 145 and 146 are provided for storage, drawer 146 accommodating cables, for example.

Figure 5:
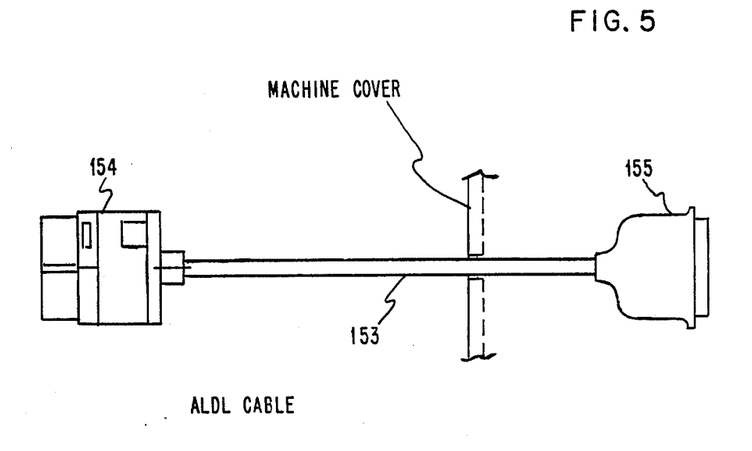
FIGS. 5, 6 and 7 illustrate various cables for use with the technician terminal.

FIG. 4 is an overview of the internal interconnections and primary elements in the technician terminal. This includes the PC AT controller 150, infrared touch panel 151 associated with the display monitor 142, an ALDL and touch adapter Card 152, which besides panel 151 inputs, receives input signals from the on-board ECM by way of the ALDL cable 153, also shown in FIG. 5. Cable 153 has connectors 154 and 155 as shown in FIG. 5 for interconnection of the technician terminal with the ECM.

Figure 6:
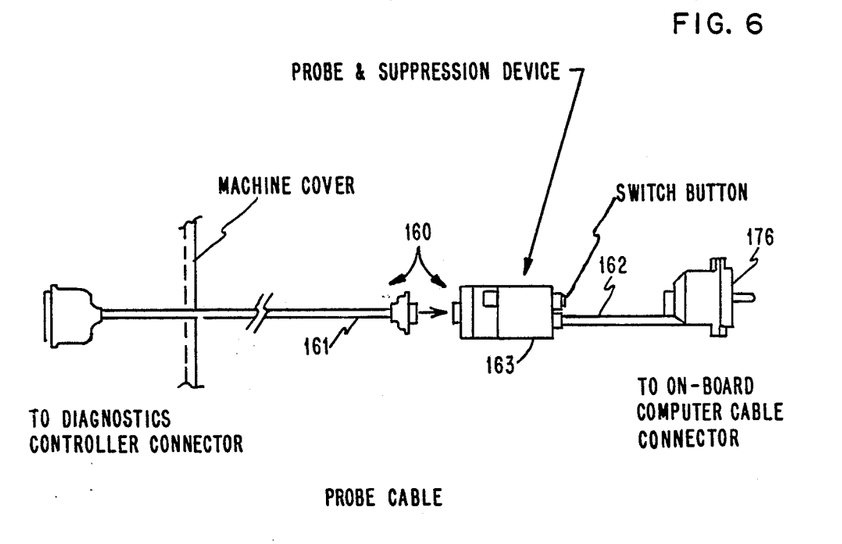

A probe adapter card 158 receives signals from a probe cable 160, also shown in greater detail in FIGS. 6 and 8.

IN FIG. 6, probe cable 160 comprises portions 161 and 162 as well as a device 163 for use by the technician during diagnostics as more fully described in the co-pending R. V. Ballou et al patent application cross-referenced above.

Figure 8A:
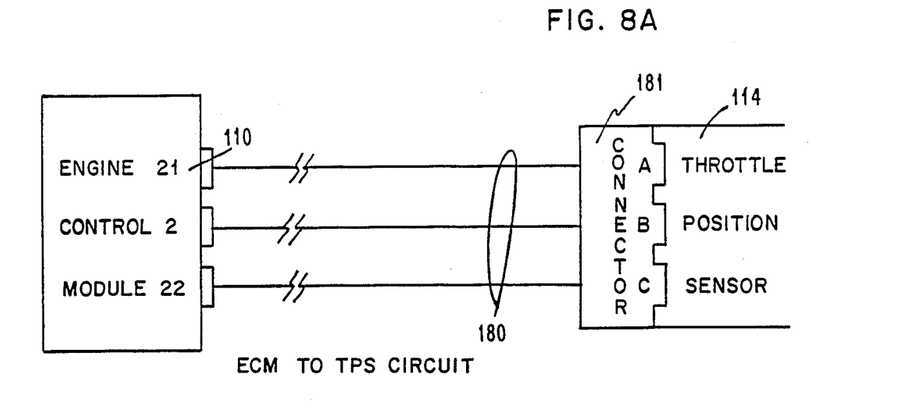
FIGS. 8A and 8B illustrate interposer cable usage in conjunction with the cable of FIG. 6.
Figure 8B:
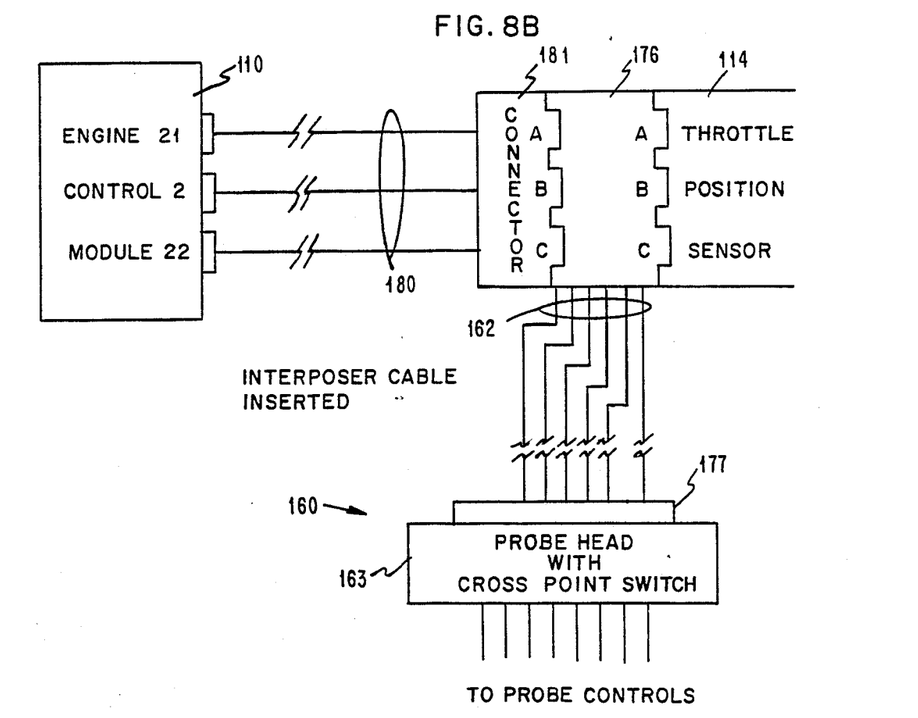

FIGS. 8A and 8B illustrate the attachment of the test probe cable 160 to a component. Normally ECM 110 is connected to component 114 by way of cable 180 with connector 181. As mentioned, Probe 160 consists of a multiple conductor cable attached to the probe controller through adapter card 158 and terminated externally at a zero force insertion type connector 176, shown diagrammatically in FIG. 8B. The attachment of the probe to a component to be tested such as throttle position sensor 114 is accomplished by use of cables having the component connector 176 on one end and a connector 177 which mates with the test probe head 163 on the other end. This cable is called a vehicle probe interface (VPI). The connector 176 of the VPI cable is inserted in line with the component to be tested and the other connector 177 is plugged into the probe head.

Use of the probe is fully described in the Ballou et al patent application.

Figure 7:
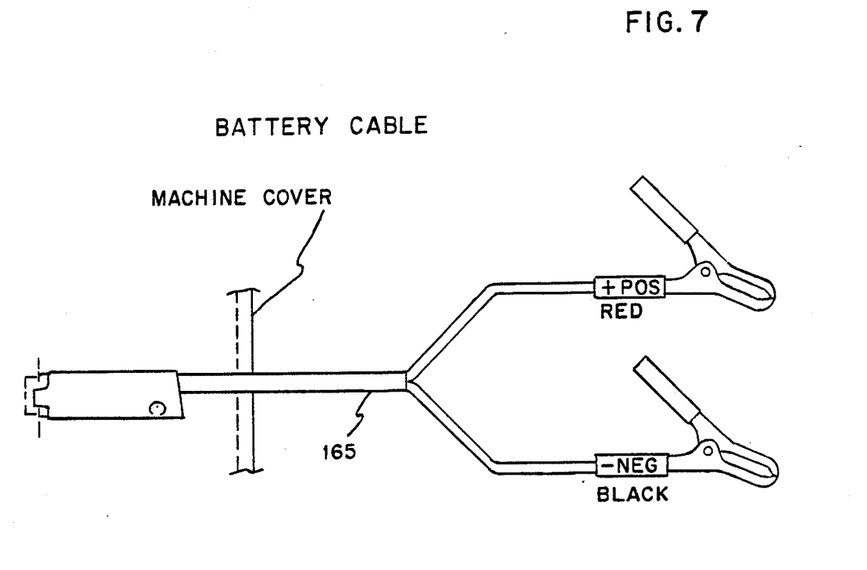

The technician terminal, may for battery checking purposes, incorporate a battery cable 165, FIG. 7.

An enhanced color adapter card 167, FIG. 4, is connected to monitor 142 for output of display signals. A printer 168 is driven by way of another adapter card (#1) designated 169, while a modem 170 and power control unit 171 are connected to controlled 150 by way of adapter card (#2) designated 172. Modem 170 can be an internal modem rather than external as shown. Both a 20 megabyte hard disk file 173 and a 1.2 megabyte floppy diskette file 174 are accommodated by adapter card 175.

The infrared touch panel and display 142 interface with the IBM PC AT electronics for technician input. The multi-function measurement cables/probes 153, 160 supported by adapter cards 152 and 158 are for use by the technician in diagnosing and isolating a vehicle failure.

Functions performed by probe 160 are controlled by Vehicle Service Procedures programmed in controller 150 which interactively request the technician to take reading, inject source voltage/ ground or verify operational circuits.

The ALDL and touch adapter card 152 located in the technician terminal reads data presented to the ALDL connector from the vehicle ECM and formats the data in a standard manner acceptable to the PC. Card 152 is programmable and accommodates various wiring configurations, data structures, and line speeds.

A FEX Development System (FDS) is used that involves PC utility programs that run on the IBM PC to support development of Vehicle Service Procedures. Examples of the utility programs are:
Table Generator
Procedure Generator
Service Bulletin Generator
File Utilities The Fault Isolation Repair Procedure Program Executor (FEX) is the systems control program that operates the Technician Terminal. The Vehicle Service Procedures operate under control of FEX to perform the following functions:
Guide Technician through service procedures
Retrieve and store data
Execute diagnostic procedures
Build and display panels
Control Test Probe operations
Control ALDL Interface In the technique disclosed herein, programs executing on the off-bard computer in the technician terminal 140, FIGS. 3 and 4, by use of a visual display, prompt the technician to change the vehicle's state. For each state change a sequence of tests are executed comparing information from the data streams against known good signatures. The signature analysis includes interrogation of single parameters and the correlation of multiple parameters.

In the service environment, where more time can be allocated for testing than that allowed at the end of an assembly line, enhanced versions of the end of line test programs can be executed to provide detection capability for more vehicle problems. Building on this ability to detect faults with a computer, the present system design describes how, by the use of artificial intelligence concepts, a technician terminal can become "smarter" in it's ability to diagnose more vehicle problems. Also, as defined in the Ballou et al patent application a multi-function program controlled probe supports fault isolation to the component to be replaced, repaired or adjusted. The system structure defines a hierarchical set of programs which utilize the contents of tables that specify what vehicle states to set, which tests to run, which signatures to use, and what repair actions to take.

The technician terminal would usually be incorporated in the communications network, FIG. 1. The network connects all technician terminals to the data base in the support system 103, FIG. 1, and to the host computer 105 which collects statistics on a periodic basis relative to the repair actions performed on the vehicles, the data being stored in the master data base 104. As indicated, the technician terminals may be connected directly to the host via a network. Statistical analysis programs are used to correlate the readings taken during problem analysis and isolation against the actual repair actions performed. Based on the results of the analysis, the signature tables, the isolation sequence tables and the probe test tables are updated to reflect this later level of "learning". The updated tables are distributed to all technician terminals over the network.

The network is also used to provide updates of new or revised programs and display panels.

Figure 9:
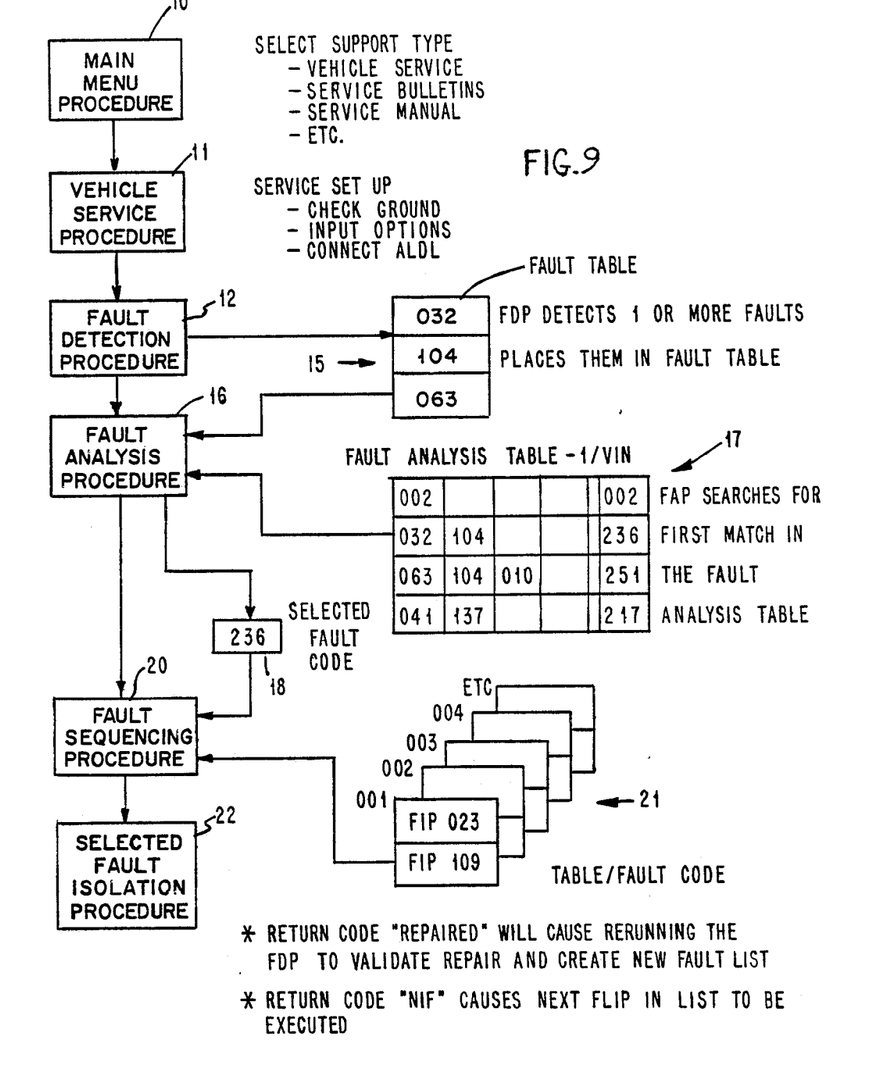
FIG. 9 illustrates the diagnostic procedures described herein.
Figure 10A:
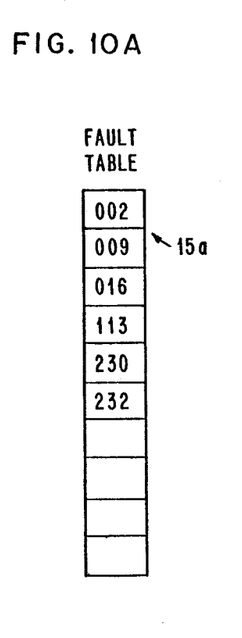
FIGS. 10A, B, and C illustrate tables as they are organized in an alternative diagnostic procedure.

The system procedure is illustrated in the flow chart shown in FIG. 9 and an alternative procedure makes use of tables shown in FIGS. 10A, B, and C.

Figure 12:
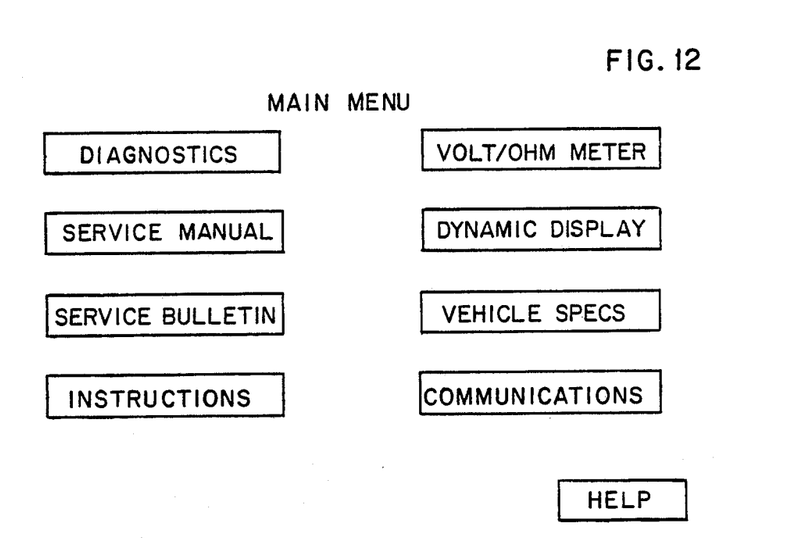
FIG. 12 shows a main menu screen displayed on a technician terminal monitor. (Same drawing sheet as FIG. 7)

The Main Menu Procedure 10 is active whenever the terminal is powered on but not in use. It displays the main menu on the monitor from which the technician selects the type of support desired. A typical main menu is shown in FIG. 12. (Same drawing sheet as FIG. 7) This includes Vehicle Service Procedure (VSP) 11 which leads the technician through the set up steps required for any service. These include:

Validate vehicle power and ground systems
Connect ALDL cable to the vehicle
Input the vehicle identification number (VIN)
Identify certain vehicle options The Fault Detection Procedure 12 (FDP) detects vehicle malfunctions by interrogating data received (via the ALDL) from the on-board computer. The data is read during different vehicle states.

Ignition on (not running)
Engine cranking
Engine idling
Engine at 2500 RPM

The data read represents the state of the various switches, sensors and actuators on the vehicle. The values read from each of the components are compared against known good parameters which are unique to the vehicle under test as identified by the VIN. Values from the components are correlated to establish that, even through they are within limits, they are also correct relative to the state of the vehicle and relative to the values read from other components having inter-dependencies.

All faults detected during this procedure are placed in table 15 and control is passed to the next hierarchical procedure. Each fault type is defined by a fault code.

The Fault Analysis Procedure 16 (FAP), using the fault codes from the tables 15 are arguments, does a sequential compare against the contents of the Fault Analysis Table 17. Each entry in this table contains one or more fault codes. Multiple codes in an entry represent a set that when detected concurrently indicate a specific component malfunction as being the most probable cause. A different fault code is assigned to each code set.

Fault Analysis Table 17 is continuously updated by the network host computer and redistributed to all terminals in the network on some periodic basis, such as daily, but overnight so as to have minimum effect on system availability. The updates to the tables are based upon statistical analysis of all Service Incident Reports (SIR's) that have been stored in the host data base since the last update period. A SIR is generated and sent to the host for each repair action performed on a vehicle. Each SIR contains the VIN, detected fault codes, component readings and repair action taken. This mechanism, over time, increases the probability of finding and correcting the malfunctioning part on the first pass through the fault analysis table since the table is ordered based on frequency of success relative to the codes.

The search of the table continues until an entry is found whose fault codes match one or more of those passed by the FDP. The fault code found such as "236" at block 18 in that entry is passed to the next hierarchical procedure.

In the Fault Sequencing Procedure 20 (FSP), for each fault code passed by the FAP, there is a list in the form of tables 21 containing the name(s) of one or more isolation procedures. These lists are also updated by the host system to reflect the results of statistical analysis of service histories. Each procedure name in the list represents a component that has required a repair action when the related fault code was detected. If the list contains more than one name, they are ordered based upon frequency of cause.

The FSP 20 causes the procedure names at the top of the list to execute at the next hierarchical level. The FAP and FSP procedures in blocks 16 and 20 may be combined into one procedure, if desired and only one table may be set up to accommodate the data stored in tables 17 and 21.

Figure 10B:
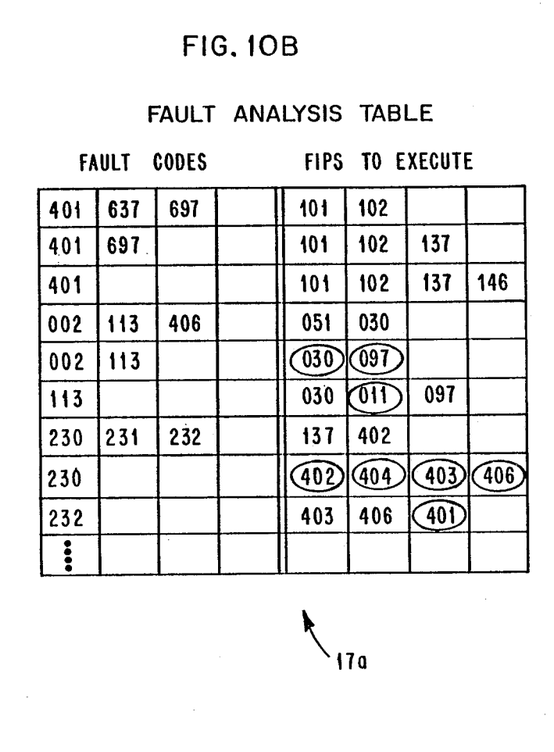
Figure 10C:
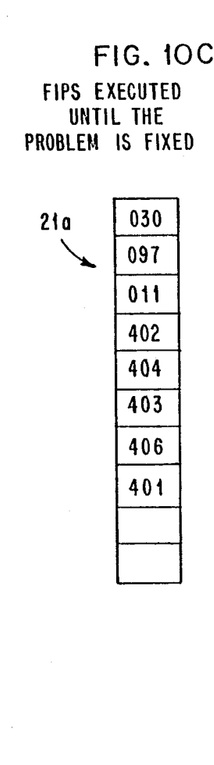

The combining of the Fault Analysis Procedure (FAP) and the Fault Sequencing Procedure (FSP) into one procedure called the Fault Analysis Procedure makes use of the tables shown in FIGS. 10A, B, and C. The Fault Analysis Procedure:

1. Sorts the fault codes in the fault table, 15a, FIG. 10A.
2. Searches the fault analysis table 17a, FIG. 10B for a line where all of the fault codes in that line are listed in the fault table.
3. When a match is found then the FIPs listed in the Fault Analysis Table 17a are executed in order, table 21a, FIG. 10C.
4. Checks to see if it has already executed that FIP. If it has then that FIP is not executed a second time.
5. Continues to execute the FIPs on matching line in the Fault Analysis Table 17a until the problem is fixed or there are no more FIPs to execute.
6. If the problem is found and repaired the control is passed back to the Fault Detection Procedure 12, FIG. 9, so it can recheck for faults.
7. If none of the FIPs listed on the line in the Fault Analysis Table 17a solve the problem then the FAP goes to the next line in table and looks for matches (Step 2 above).

Given the faults logged in the Fault Table 15a and the associated Fault Analysis table 17a the circled FIPs in FIG. 10B would be executed.

A Fault Isolation Procedure as at block 22 (FIP) is executed for the electrical or electronic components on the vehicle the procedure being selected from the group of procedures chosen by FSP 20. These procedures perform a complete test of the related part using the multi-function test probe 160. A complete "black box" analysis of the component is performed. There are, of course, some components such as lights, radios, power windows, door locks, etc. that are not covered by procedures. Many vehicles already have FIPs which cover these components. There are also FIPs for non-electrical components such as throttle linkages, vacuum hoses, fuel system, etc.

This test of components has one of the following results:

The test fails which will cause the FIP to invoke the proper procedure to guide the technician in the repair, replace or adjustment required. When the repair action is completed, the same FIP will re-run the test to validate the fix, then return control to the FDP to determine if the repair action eliminated all the faults found on the initial pass. If not, then the same scenario is again followed.

If the test completes with no failures, the FIP returns control to the FAP which selects the next FIP names in the list and another suspected component is tested. If there are no other FIP names in the list, the FAP continues to search the fault analysis table until another match is found. This scenario is repeated until all faults have been eliminated.

Thus, the fault repair procedures guide the technician through the proper steps to accomplish the repair, replacement or adjustment required. This guidance is provided by sequences of display panels containing such things as adjustment procedures, part locations, removal sequences, etc.

In the event that no trouble is found after having exercised all the FIPs that were invoked relative to the detected faults, communication may be established through the network to the host system 105 and the fault codes detected, along with user defined symptoms, are transmitted to the data base 104. Host resident programs interrogate the service history files and transmit back to the terminal additional fault isolation procedures to be tried.

Figure 11:
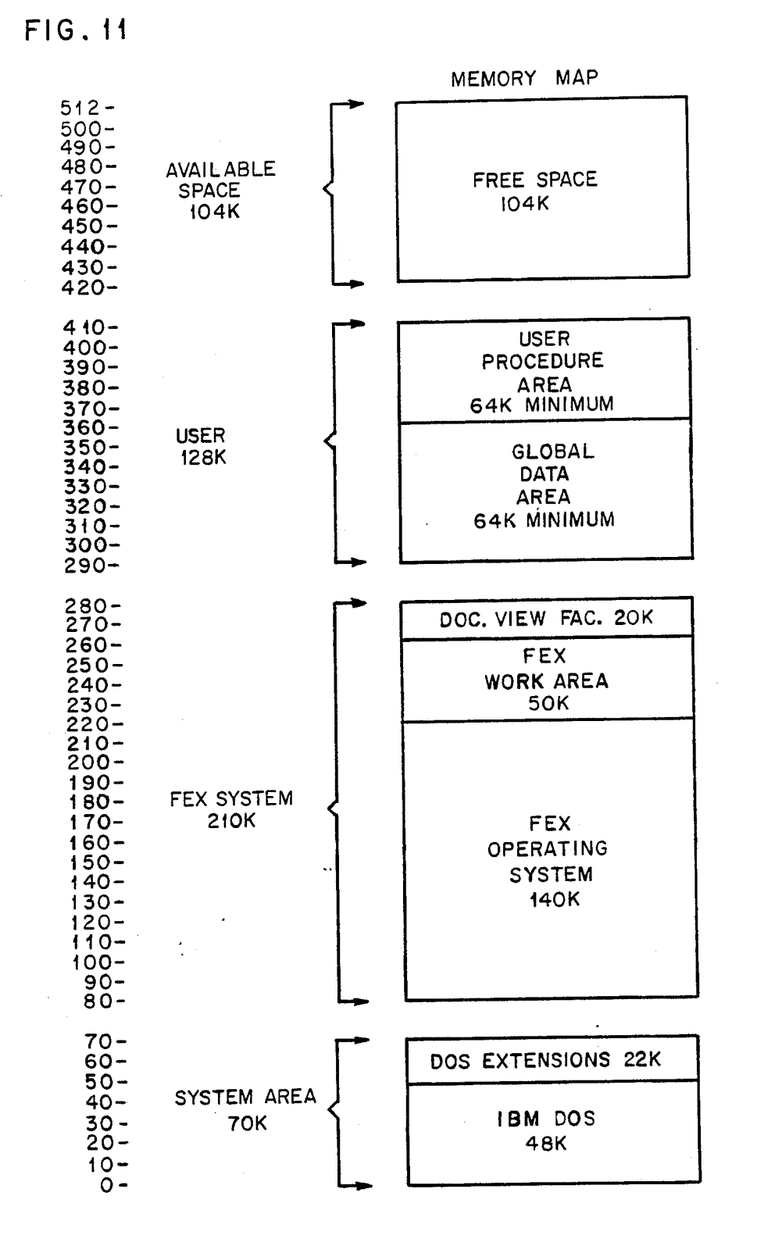
FIG. 11 shows a typical utilization of the storage in the technician terminal computer, a memory map for the software execution system.

FIG. 11 illustrates a memory map assignment in PC AT controller 150, FIG. 4, for the programs used to accomplish the procedures set forth in connection with FIG. 9.

While a preferred embodiment of the invention has been illustrated and described, it is to be understood that there is no intention to limit the invention to the precise construction herein disclosed and the right is reserved to all changes and modifications coming within the scope of the invention as defined in the appended claims.

We claim:

1. A diagnostic method for use in diagnosing a vehicle utilizing a diagnostic system, the vehicle having an on-board computer control system for monitoring and controlling vehicle functions and the diagnostic system including a technician terminal having a diagnostic controller for processing diagnostic signals representative of vehicle conditions, said controller having data entry means, data output means and storage means for storing vehicle parameters and diagnostic routines and said terminal having a display means for providing instructions for fault repair sequences, said method comprising the steps of:

(1) displaying a main menu on said display means from which a vehicle setup is initiated including connecting the vehicle to the terminal and identifying the vehicle and any vehicle options;

(2) utilizing a Fault Detection Procedure for detecting vehicle malfunctions by interrogating data received from said on-board computer during different vehicle states: ignition on (not running), engine cranking, engine idling and engine at higher speed and comparing said data with known parameters in said diagnostic controller storage means, any faults detected being stored in a fault table by fault code;

(3) analyzing by a Fault Analysis Procedure the detected fault codes stored in the fault table by comparison with fault codes stored in a Fault Analysis Table to indicate a specific component suspected of being at fault, the Fault Analysis Table being periodically up-dated from a host data base by statistical analysis of prior service reports and the Fault Analysis Procedure supplying all fault codes in the Fault Analysis Table that match one or more of those provided by the Fault Detection Procedure;

(4) accessing and selecting in a Fault Sequencing Procedure, for each fault supplied by the Fault Analysis Procedure, one or more isolation procedures stored in a light in said diagnostic controller, such list each being related to a particular component in said vehicle and also being periodically updated from said host data base, the Fault Sequencing Procedure initiating execution of the procedure at the top of the list;

(5) utilizing said selected Fault Isolation Procedure and additional Fault Isolation Procedures in said list for testing of a related part in said vehicle by providing guidance via said display means for repairing, replacing or adjusting the related component.

2. The method of claim 1 further comprising the step of:

repeating the selected one or more Fault Isolation Procedures in the event a check determines that the fault has not been corrected.

3. The method of claim 1 further comprising the step of:

transmitting results of the Fault Isolation Procedures to a host computer for analysis.

4. A diagnostic method for use in diagnosing a vehicle utilizing a diagnostic system, the vehicle having an on-board computer control system for monitoring and controlling vehicle functions and the diagnostic system including a technician terminal having a diagnostic controller for processing diagnostic signals representative of vehicle conditions said controller having data entry means, data output means and storage means for storing vehicle parameters and diagnostic routines and said technician terminal having a display means for providing instructions for fault repair sequences, said method comprising the steps of:

(1) displaying a main menu on said display means from which a vehicle setup is initiated including connecting the vehicle to the terminal and identifying the vehicle and any vehicle options;

(2) utilizing a Fault Detection Procedure for detecting vehicle malfunctions by interrogating data received from said on-board computer during different vehicle states: ignition on (not running), engine cranking, engine idling and engine at higher speed and comparing said data with known parameters in said diagnostic controller storage means, any faults detected being stored in a fault table by fault code;

(3) analyzing by a Fault Analysis Procedure the detected fault codes stored in the fault table by comparison with lines of fault codes stored in a first portion of a Fault Analysis Table to indicate a specific component suspected of being at fault, accessing and selecting for each fault supplied by the Fault Analysis Procedure, one or more Fault Isolation Procedures stored in the form of fault code lists in a second portion of said Fault Analysis Table, such lists each being related to a particular component in said vehicle, storing one or more selected Fault Isolation Procedures in a predetermined order, the Fault Analysis Procedure initiating execution of the first Fault Isolation Procedure at the top of each list;

(4) utilizing the said first Fault Isolation Procedure and additional stored Fault Isolation Procedures if required, for testing of a related component in said vehicle by providing guidance via said display means for repairing, replacing or adjusting the related component.

5. The method of claim 4 further comprising the step of:

repeating the selected one or more Fault Isolation Procedures in the event a check determines that the fault has not been corrected.

6. The method of claim 4 further comprising the step of:

transmitting results of the Fault Isolation Procedures to a host computer for analysis.

* * * * *